(12) United States Patent
Sarin et al.

(10) Patent No.: US 7,751,253 B2
(45) Date of Patent: Jul. 6, 2010

(54) ANALOG SENSING OF MEMORY CELLS WITH A SOURCE FOLLOWER DRIVER IN A SEMICONDUCTOR MEMORY DEVICE

(75) Inventors: Vishal Sarin, Cupertino, CA (US); Jung-Sheng Hoei, Fremont, CA (US); Frankie F. Roohparvar, Monte Sereno, CA (US)

(73) Assignee: Micron Technology, Inc., Boise, ID (US)

( * ) Notice: Subject to any disclaimer, the term of this patent is extended or adjusted under 35 U.S.C. 154(b) by 233 days.

(21) Appl. No.: 12/049,604

(22) Filed: Mar. 17, 2008

(65) Prior Publication Data

US 2009/0231926 A1   Sep. 17, 2009

(51) Int. Cl.
*G11C 16/06* (2006.01)
(52) U.S. Cl. .............................. 365/185.22; 365/185.08; 365/185.18; 365/185.2; 365/185.21
(58) Field of Classification Search ............. 365/185.08, 365/185.18, 185.2, 185.21, 185.22
See application file for complete search history.

(56) References Cited

U.S. PATENT DOCUMENTS

2005/0248986 A1*  11/2005  Wong ..................... 365/185.22
2009/0219756 A1*   9/2009  Schroegmeier et al. ..... 365/163

\* cited by examiner

*Primary Examiner*—Hoai V Ho
(74) *Attorney, Agent, or Firm*—Leffert Jay & Polglaze P.A.

(57) ABSTRACT

Memory devices, methods, and sample and hold circuits are disclosed, including a memory device that includes a sample and hold circuit coupled to a bit line. One such sample and hold circuit includes a read circuit, a verify circuit, and a reference circuit. The read circuit stores a read threshold voltage that was read from a selected memory cell. The verify circuit stores a target threshold voltage that is compared to the read threshold voltage to generate an inhibit signal when the target and read threshold voltages are substantially equal. The reference circuit stores a reference threshold voltage that can be used to translate the read threshold voltage to compensate for a transistor voltage drop and/or temperature variations.

18 Claims, 9 Drawing Sheets

ANALOG SENSING OF MEMORY CELLS WITH A SOURCE FOLLOWER DRIVER IN A SEMICONDUCTOR MEMORY DEVICE

TECHNICAL FIELD

The present disclosure relates generally to semiconductor memory and more particularly, in one or more embodiments, to solid state non-volatile memory devices.

BACKGROUND

Electronic devices commonly have some type of bulk storage device available to them. A common example is a hard disk drive (HDD). HDDs are capable of large amounts of storage at relatively low cost, with current consumer HDDs available with over one terabyte of capacity.

HDDs generally store data on rotating magnetic media or platters. Data is typically stored as a pattern of magnetic flux reversals on the platters. To write data to a typical HDD, the platter is rotated at high speed while a write head floating above the platter generates a series of magnetic pulses to align magnetic particles on the platter to represent the data. To read data from a typical HDD, resistance changes are induced in a magnetoresistive read head as it floats above the platter rotated at high speed. In practice, the resulting data signal is an analog signal whose peaks and valleys are the result of the magnetic flux reversals of the data pattern. Digital signal processing techniques called partial response maximum likelihood (PRML) are then used to sample the analog data signal to determine the likely data pattern responsible for generating the data signal.

HDDs have certain drawbacks due to their mechanical nature. HDDs are susceptible to damage or excessive read/write errors due to shock, vibration or strong magnetic fields. In addition, they are relatively large users of power in portable electronic devices.

Another example of a bulk storage device is a solid state drive (SSD). Instead of storing data on rotating media, SSDs utilize semiconductor memory devices to store their data, but include an interface and form factor making them appear to their host system as if they are a typical HDD. The memory devices of SSDs are typically non-volatile flash memory devices.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage nodes (i.e., floating gates, trapping layers or other physical phenomena), determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Unlike HDDs, the operation of SSDs is generally not subject to vibration, shock or magnetic field concerns due to their solid state nature. Similarly, without moving parts, SSDs have lower power requirements than HDDs. However, SSDs currently have much lower storage capacities compared to HDDs of the same form factor and a significantly higher cost per bit.

For the reasons stated above, and for other reasons which will become apparent to those skilled in the art upon reading and understanding the present specification, there is a need in the art for alternative bulk storage options.

DETAILED DESCRIPTION

Figure 1:
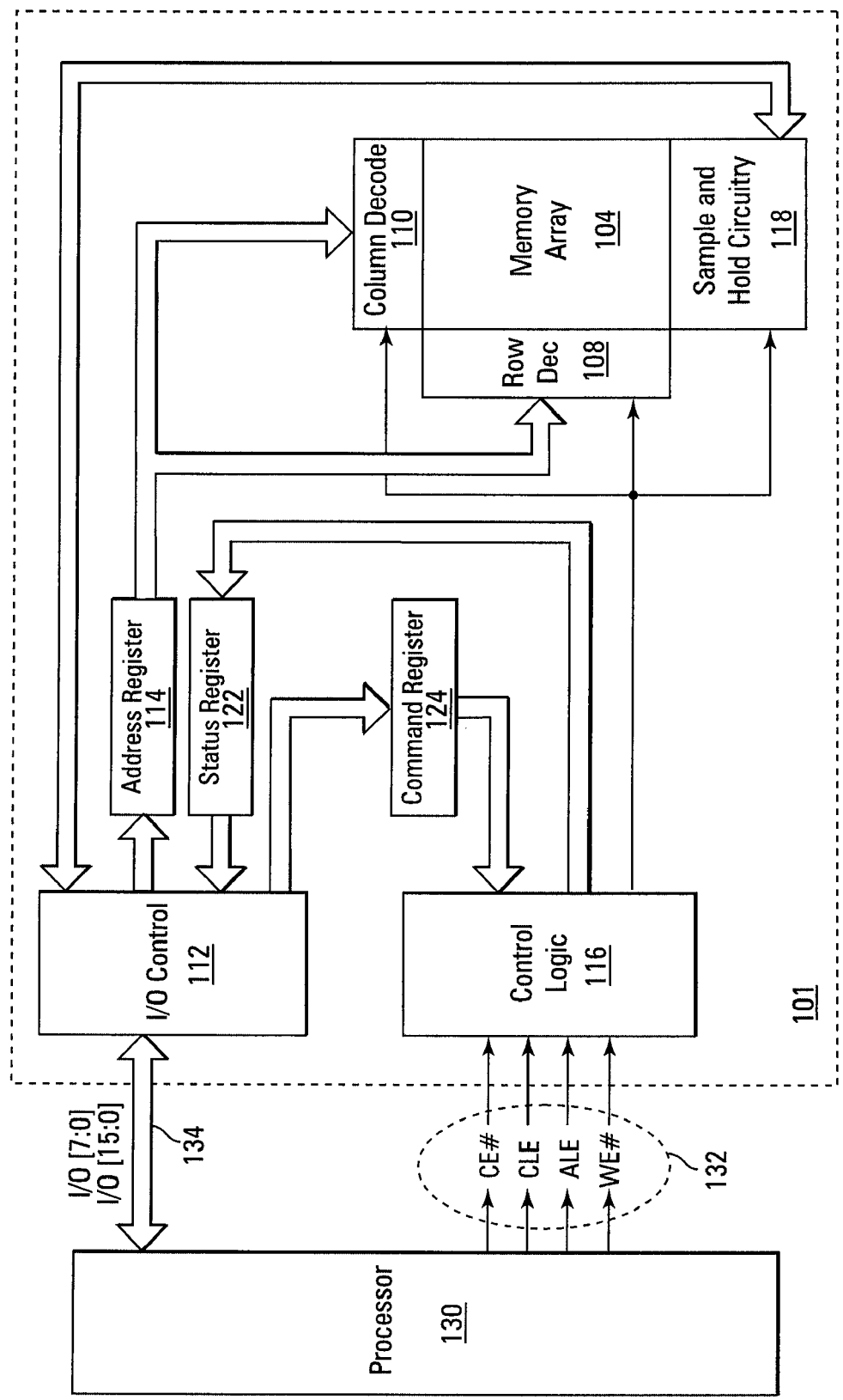
FIG. 1 is a simplified block diagram of a memory device according to an embodiment of the disclosure.

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

Traditional solid-state memory devices pass data in the form of binary signals. Typically, a ground potential represents a first logic level of a bit of data, e.g., a '0' data value, while a supply potential represents a second logic level of a bit of data, e.g., a '1' data value. A multi-level cell (MLC) may be assigned, for example, four different threshold voltage ($V_t$) ranges of 200 mV for each range, with each range corresponding to a distinct data state, thereby representing four data values or bit patterns. Typically, a dead space or margin of 0.2V to 0.4V is between each range to keep the $V_t$ distributions from overlapping. If the $V_t$ of the cell is within the first range, the cell may be deemed to store a logical 11 state and is typically considered the erased state of the cell. If the $V_t$ is within the second range, the cell may be deemed to store a logical 10 state. If the $V_t$ is within the third range, the cell may be deemed to store a logical 00 state. And if the $V_t$ is within the fourth range, the cell may be deemed to store a logical 01 state.

When programming a traditional MLC device as described above, cells are generally first erased, as a block, to correspond to the erased state. Following erasure of a block of cells, the least-significant bit (LSB) of each cell is first programmed, if necessary. For example, if the LSB is a 1, then no programming is necessary, but if the LSB is a 0, then the $V_t$ of the target memory cell is moved from the $V_t$ range corresponding to the 11 logic state to the $V_t$ range corresponding to the 10 logic state. Following programming of the LSBs, the most-significant bit (MSB) of each cell is programmed in a similar manner, shifting the $V_t$ where necessary. When reading an MLC of a traditional memory device, one or more read operations determine generally into which of the ranges the $V_t$ of the cell voltage falls. For example, a first read operation may determine whether the $V_t$ of the target memory cell is indicative of the MSB being a 1 or a 0 while a second read operation may determine whether the $V_t$ of the target memory cell in indicative of the LSB being a 1 or a 0. In each case, however, a single bit is returned from a read operation of a target memory cell, regardless of how many bits are stored on each cell. This problem of multiple program and read operations becomes increasingly troublesome as more bits are stored on each MLC. Because each such program or read operation is a binary operation, i.e., each programs or returns a single bit of information per cell, storing more bits on each MLC leads to longer operation times.

The memory devices of an illustrative embodiment store data as $V_t$ ranges on the memory cells. In contrast to traditional memory devices, however, program and read operations are capable of utilizing data signals not as discrete bits of MLC data values, but as full representations of MLC data values, such as their complete bit patterns. For example, in a two-bit MLC device, instead of programming a cell's LSB and subsequently programming that cell's MSB, a target threshold voltage may be programmed representing the bit pattern of those two bits. That is, a series of program and verify operations would be applied to a memory cell until that memory cell obtained its target threshold voltage rather than programming to a first threshold voltage for a first bit, shifting to a second threshold voltage for a second bit, etc. Similarly, instead of utilizing multiple read operations to determine each bit stored on a cell, the threshold voltage of the cell may be determined and passed as a single signal representing the complete data value or bit pattern of the cell. The memory devices of the various embodiments do not merely look to whether a memory cell has a threshold voltage above or below some nominal threshold voltage as is done in traditional memory devices. Instead, a voltage signal is generated that is representative of the actual threshold voltage of that memory cell across the continuum of possible threshold voltages. An advantage of this approach becomes more significant as the bits per cell count is increased. For example, if the memory cell were to store eight bits of information, a single read operation would return a single analog data signal representative of eight bits of information.

FIG. 1 is a simplified block diagram of a memory device 101 according to an embodiment of the disclosure. Memory device 101 includes an array of memory cells 104 arranged in rows and columns. Although the various embodiments will be described primarily with reference to NAND memory arrays, the various embodiments are not limited to a specific architecture of the memory array 104. Some examples of other array architectures suitable for the present embodiments include NOR arrays, AND arrays, and virtual ground arrays. In general, however, the embodiments described herein are adaptable to any array architecture permitting generation of a data signal indicative of the threshold voltage of each memory cell.

A row decode circuitry 108 and a column decode circuitry 110 are provided to decode address signals provided to the memory device 101. Address signals are received and decoded to access memory array 104. Memory device 101 also includes input/output (I/O) control circuitry 112 to manage input of commands, addresses and data to the memory device 101 as well as output of data and status information from the memory device 101. An address register 114 is coupled between I/O control circuitry 112 and row decode circuitry 108 and column decode circuitry 110 to latch the address signals prior to decoding. A command register 124 is coupled between I/O control circuitry 112 and control logic 116 to latch incoming commands. Control logic 116 controls access to the memory array 104 in response to the commands and generates status information for the external processor 130. The control logic 116 is coupled to row decode circuitry 108 and column decode circuitry 110 to control the row decode circuitry 108 and column decode circuitry 110 in response to the addresses.

Control logic 116 is also coupled to a sample and hold circuitry 118. The sample and hold circuitry 118 latches data, either incoming or outgoing, in the form of analog voltage levels. For example, the sample and hold circuitry could contain capacitors or other analog storage devices for sampling either an incoming voltage signal representing data to be written to a memory cell or an outgoing voltage signal indicative of the threshold voltage sensed from a memory cell. The sample and hold circuitry 118 may further provide for amplification and/or buffering of the sampled voltage to provide a stronger data signal to an external device.

The handling of analog voltage signals may take an approach similar to an approach well known in the area of CMOS imager technology, where charge levels generated at pixels of the imager in response to incident illumination are stored on capacitors. These charge levels are then converted to voltage signals using a differential amplifier with a reference capacitor as a second input to the differential amplifier. The output of the differential amplifier is then passed to analog-to-digital conversion (ADC) devices to obtain a digital value representative of an intensity of the illumination. In the present embodiments, a charge may be stored on a capacitor in response to subjecting it to a voltage level indicative of an actual or target threshold voltage of a memory cell for reading or programming, respectively, the memory cell. This charge could then be converted to an analog voltage using a differential amplifier having a grounded input or other reference signal as a second input. The output of the differential amplifier could then be passed to the I/O control circuitry 112 for output from the memory device, in the case of a read operation, or used for comparison during one or more verify operations in programming the memory device. It is noted that the I/O control circuitry 112 could optionally include analog-to-digital conversion functionality and digital-to-analog conversion (DAC) functionality to convert read data from an analog signal to a digital bit pattern and to convert write data from a digital bit pattern to an analog signal such that the memory device 101 could be adapted for communication with either an analog or digital data interface.

During a write operation, target memory cells of the memory array 104 are programmed until voltages indicative of their $V_t$ levels match the levels held in the sample and hold circuitry 118. This can be accomplished, as one example, using differential sensing devices to compare the held voltage level to a threshold voltage of the target memory cell. Much like traditional memory programming, programming pulses could be applied to a target memory cell to increase its threshold voltage until reaching or exceeding the desired value. In a read operation, the $V_t$ levels of the target memory cells are passed to the sample and hold circuitry 118 for transfer to an external processor (not shown in FIG. 1) either directly as analog signals or as digitized representations of the analog signals depending upon whether ADC/DAC functionality is provided external to, or within, the memory device.

Threshold voltages of cells may be determined in a variety of manners. For example, a word line voltage could be sampled at the point when the target memory cell becomes activated. Alternatively, a boosted voltage could be applied to a first source/drain side of a target memory cell, and the threshold voltage could be taken as a difference between its control gate voltage and the voltage at its other source/drain side. By coupling the voltage to a capacitor, charge would be shared with the capacitor to store the sampled voltage. Note that the sampled voltage need not be equal to the threshold voltage, but merely indicative of that voltage. For example, in the case of applying a boosted voltage to a first source/drain side of the memory cell and a known voltage to its control gate, the voltage developed at the second source/drain side of the memory cell could be taken as the data signal as the developed voltage is indicative of the threshold voltage of the memory cell.

Sample and hold circuitry 118 may include caching, i.e., multiple storage locations for each data value, such that the memory device 101 may be reading a next data value while passing a first data value to the external processor, or receiving a next data value while writing a first data value to the memory array 104. A status register 122 is coupled between I/O control circuitry 112 and control logic 116 to latch the status information for output to the external processor.

Memory device 101 receives control signals at control logic 116 over a control link 132. The control signals may include a chip enable CE#, a command latch enable CLE, an address latch enable ALE, and a write enable WE#. Memory device 101 may receive commands (in the form of command signals), addresses (in the form of address signals), and data (in the form of data signals) from an external processor over a multiplexed input/output (I/O) bus 134 and output data to the external processor over I/O bus 134.

In a specific example, commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data may be received over input/output (I/O) pins [7:0] for a device capable of receiving eight parallel signals, or input/output (I/O) pins [15:0] for a device capable of receiving sixteen parallel signals, at I/O control circuitry 112 and are transferred to sample and hold circuitry 118. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 1 has been simplified to help focus on the embodiments of the disclosure. Additionally, while the memory device of FIG. 1 has been described in accordance with popular conventions for receipt and output of the various signals, it is noted that the various embodiments are not limited by the specific signals and I/O configurations described unless expressly noted herein. For example, command and address signals could be received at inputs separate from those receiving the data signals, or data signals could be transmitted serially over a single I/O line of I/O bus 134. Because the data signals represent bit patterns instead of individual bits, serial communication of an 8-bit data signal could be as efficient as parallel communication of eight signals representing individual bits.

Figure 2:
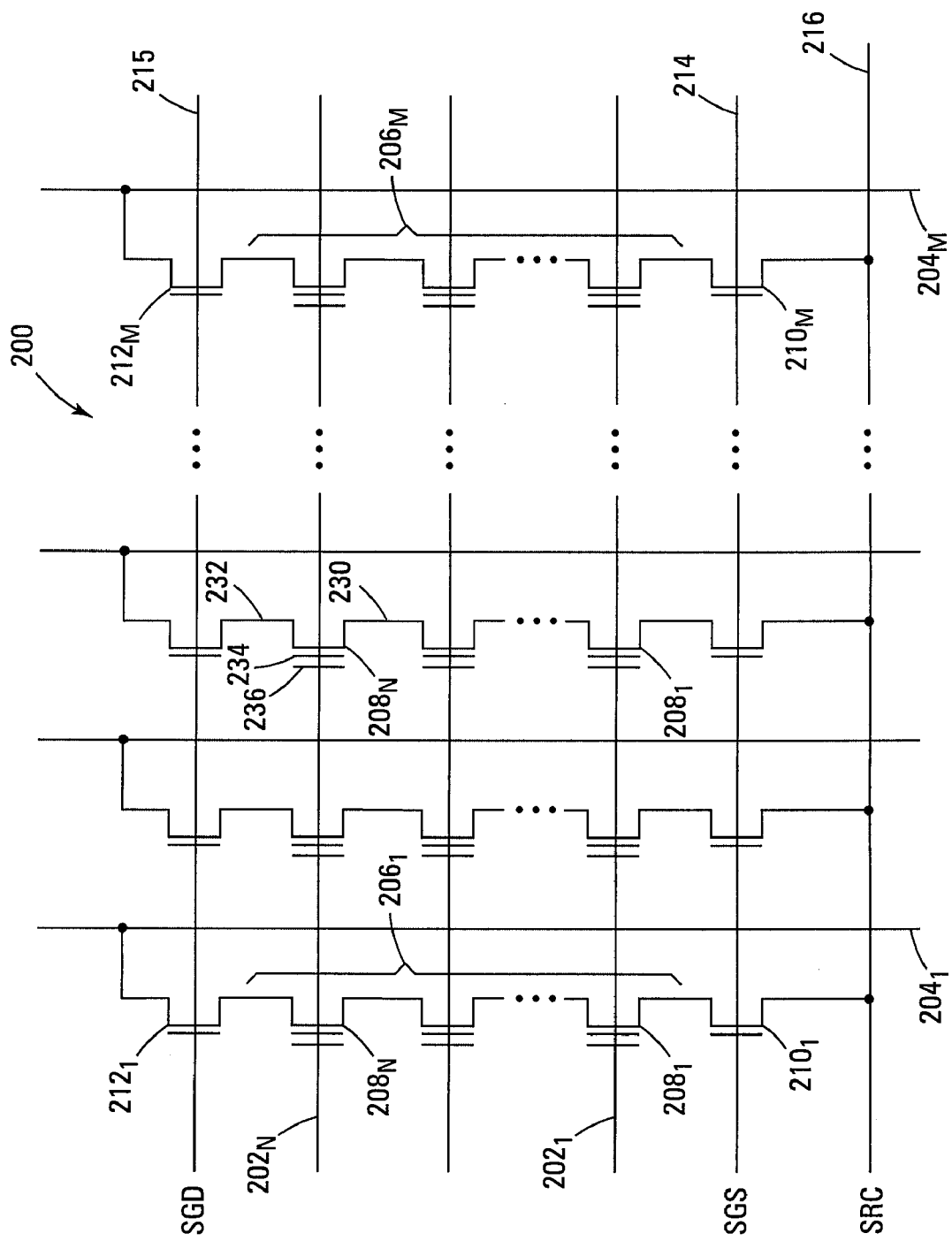
FIG. 2 is a schematic of a portion of an example NAND memory array as might be found in the memory device of FIG. 1.

FIG. 2 is a schematic of a portion of an example NAND memory array 200 as might be found in the memory array 104 of FIG. 1. As shown in FIG. 2, the memory array 200 includes word lines $202_1$ to $202_N$ and intersecting bit lines $204_1$ to $204_M$. For ease of addressing in the digital environment, the number of word lines 202 and the number of bit lines 204 are generally each some power of two.

Memory array 200 includes NAND strings $206_1$ to $206_M$. Each NAND string includes transistors $208_1$ to $208_N$, each located at an intersection of a word line 202 and a bit line 204. The transistors 208, depicted as floating-gate transistors in FIG. 2, represent non volatile memory cells for storage of data. The floating-gate transistors 208 of each NAND string 206 are connected in series source to drain between one or more source select gates 210, e.g., a field-effect transistor (FET), and one or more drain select gates 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate of each source select gate 210 is connected to source select line 214. If multiple source select gates 210 are utilized for a given NAND string 206, they would be coupled in series between the common source line 216 and the first floating-gate transistor 208 of that NAND string 206.

The drain of each drain select gate 212 is connected to a local bit line 204 for the corresponding NAND string at a drain contact. For example, the drain of drain select gate $212_1$ is connected to the local bit line $204_1$ for the corresponding NAND string $206_1$ at a drain contact. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$. If multiple drain select gates 212 are utilized for a given NAND string 206, they would be coupled in series between the corresponding bit line 204 and the last floating-gate transistor $208_N$ of that NAND string 206.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202. Other forms of transistors 208 may also be utilized with embodiments of the disclosure, such as NROM, magnetic or ferroelectric transistors and other transistors capable of being programmed to assume one of two or more threshold voltage ranges.

Figure 3:
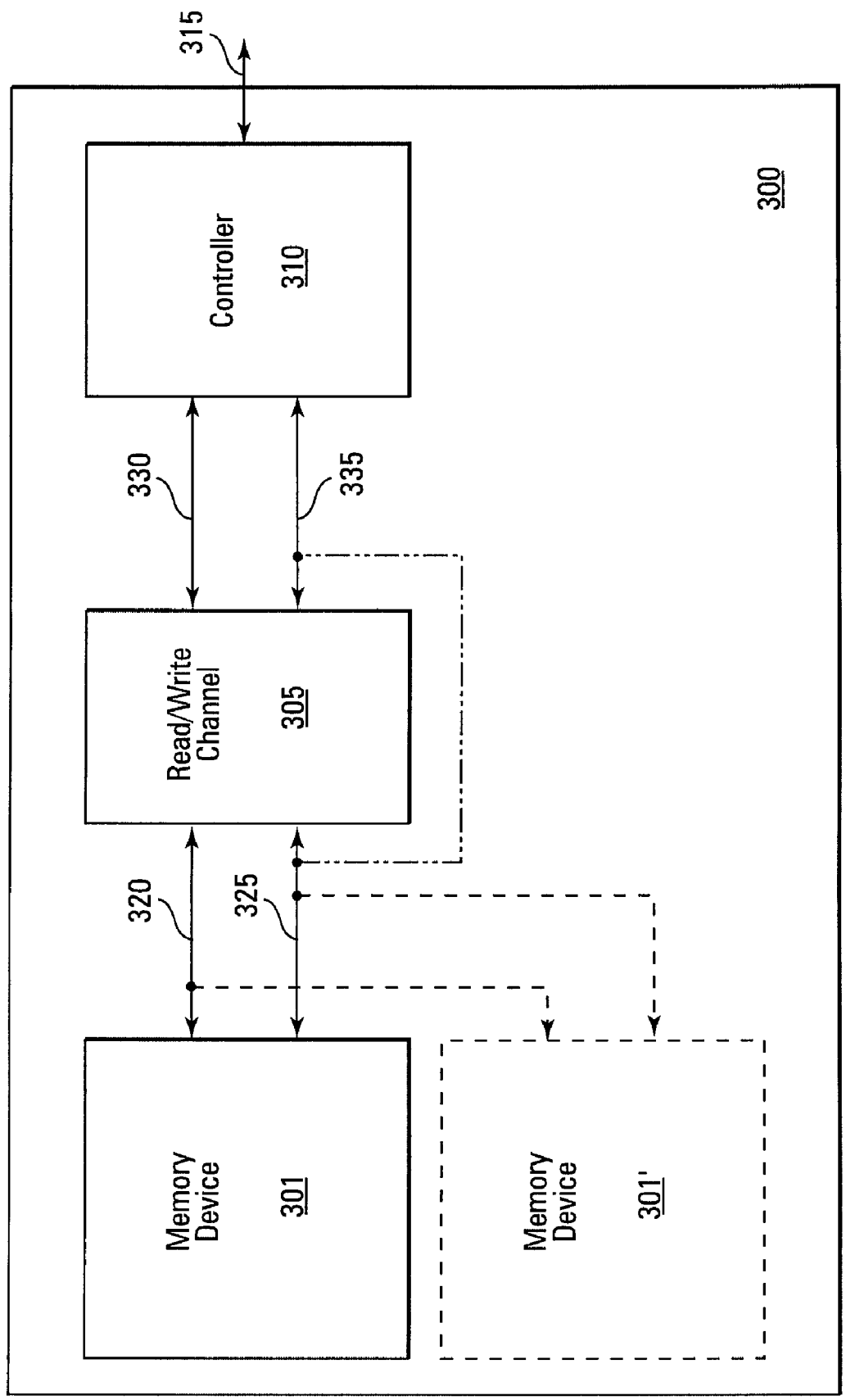
FIG. 3 is a block schematic of a solid state bulk storage system in accordance with one embodiment of the present disclosure.

Memory devices of the various embodiments may be advantageously used in bulk storage devices. For various embodiments, these bulk storage devices may take on the same form factor and communication bus interface of traditional HDDs, thus allowing them to replace such drives in a variety of applications. Some common form factors for HDDs include the 3.5", 2.5" and PCMCIA (Personal Computer Memory Card International Association) form factors commonly used with current personal computers and larger digital media recorders, as well as 1.8" and 1" form factors commonly used in smaller personal appliances, such as mobile telephones, personal digital assistants (PDAs) and digital media players. Some common bus interfaces include universal serial bus (USB), AT attachment interface (ATA) [also known as integrated drive electronics or IDE], serial ATA (SATA), small computer systems interface (SCSI) and the Institute of Electrical and Electronics Engineers (IEEE) 1394 standard. While a variety of form factors and communication interfaces were listed, the embodiments are not limited to a specific form factor or communication standard. Furthermore, the embodiments need not conform to a HDD form factor or communication interface. FIG. 3 is a block schematic of a solid state bulk storage device 300 in accordance with one embodiment of the present disclosure.

The bulk storage device 300 includes a memory device 301 in accordance with an embodiment of the disclosure, a read/write channel 305 and a controller 310. The read/write channel 305 provides for analog-to-digital conversion of data signals received from the memory device 301 as well as digital-to-analog conversion of data signals received from the controller 310. The controller 310 provides for communication between the bulk storage device 300 and an external processor (not shown in FIG. 3) through bus interface 315. It is noted that the read/write channel 305 could service one or more additional memory devices, as depicted by memory device 301' in dashed lines. Selection of a single memory device 301 for communication can be handled through a multi-bit chip enable signal or other multiplexing scheme.

The memory device 301 is coupled to a read/write channel 305 through an analog interface 320 and a digital interface 325. The analog interface 320 provides for the passage of analog data signals between the memory device 301 and the read/write channel 305 while the digital interface 325 provides for the passage of control signals, command signals and address signals from the read/write channel 305 to the memory device 301. The digital interface 325 may further provide for the passage of status signals from the memory device 301 to the read/write channel 305. The analog interface 320 and the digital interface 325 may share signal lines as noted with respect to the memory device 101 of FIG. 1. Although the embodiment of FIG. 3 depicts a dual analog/digital interface to the memory device, functionality of the read/write channel 305 could optionally be incorporated into the memory device 301 as discussed with respect to FIG. 1 such that the memory device 301 communicates directly with the controller 310 using only a digital interface for passage of control signals, command signals, status signals, address signals and data signals.

The read/write channel 305 is coupled to the controller 310 through one or more interfaces, such as a data interface 330 and a control interface 335. The data interface 330 provides for the passage of digital data signals between the read/write channel 305 and the controller 310. The control interface 335 provides for the passage of control signals, command signals and address signals from the controller 310 to the read/write channel 3 05. The control interface 335 may further provide for the passage of status signals from the read/write channel 305 to the controller 310. Status and command/control signals may also be passed directly between the controller 310 and the memory device 301 as depicted by the dashed line connecting the control interface 335 to the digital interface 325.

Although depicted as two distinct devices in FIG. 3, the functionality of the read/write channel 305 and the controller 310 could alternatively be performed by a single integrated circuit device. And while maintaining the memory device 301 as a separate device would provide more flexibility in adapting the embodiments to different form factors and communication interfaces, because it is also an integrated circuit device, the entire bulk storage device 300 could be fabricated as a single integrated circuit device.

The read/write channel 305 is a signal processor adapted to at least provide for conversion of a digital data stream to an analog data stream and vice versa. A digital data stream provides data signals in the form of binary voltage levels, i.e., a first voltage level indicative of a bit having a first binary data value, e.g., 0, and a second voltage level indicative of a bit having a second binary data value, e.g., 1. An analog data stream provides data signals in the form of analog voltages having more than two levels, with different voltage levels or ranges corresponding to different bit patterns of two or more bits. For example, in a system adapted to store two bits per memory cell, a first voltage level or range of voltage levels of an analog data stream could correspond to a bit pattern of 11, a second voltage level or range of voltage levels of an analog data stream could correspond to a bit pattern of 10, a third voltage level or range of voltage levels of an analog data stream could correspond to a bit pattern of 00 and a fourth voltage level or range of voltage levels of an analog data stream could correspond to a bit pattern of 01. Thus, one analog data signal in accordance with the various embodiments would be converted to two or more digital data signals, and vice versa.

In practice, control and command signals are received at the bus interface 315 for access of the memory device 301 through the controller 310. Addresses and data values may also be received at the bus interface 315 depending upon what type of access is desired, e.g., write, read, format, etc. In a shared bus system, the bus interface 315 would be coupled to a bus along with a variety of other devices. To direct communications to a specific device, an identification value may be placed on the bus indicating which device on the bus is to act upon a subsequent command. If the identification value matches the value taken on by the bulk storage device 300, the controller 310 would then accept the subsequent command at the bus interface 315. If the identification value did not match, the controller 310 would ignore the subsequent communication. Similarly, to avoid collisions on the bus, the various devices on a shared bus may instruct other devices to cease outbound communication while they individually take control of the bus. Protocols for bus sharing and collision avoidance are well known and will not be detailed herein. The controller 310 then passes the command, address and data signals on to the read/write channel 305 for processing. Note that the command, address and data signals passed from the controller 310 to the read/write channel 305 need not be the same signals received at the bus interface 315. For example, the communication standard for the bus interface 315 may differ from the communication standard of the read/write channel 3 05 or the memory device 301. In this situation, the controller 310 may translate the commands and/or addressing scheme prior to accessing the memory device 301. In addition, the controller 310 may provide for load leveling within the one or more memory devices 301, such that physical addresses of the memory devices 301 may change over time for a given logical address. Thus, the controller 310 would map the logical address from the external device to a physical address of a target memory device 301.

For write requests, in addition to the command and address signals, the controller 310 would pass digital data signals to the read/write channel 305. For example, for a 16-bit data word, the controller 310 would pass 16 individual signals having a first or second binary logic level. The read/write channel 305 would then convert the digital data signals to an analog data signal representative of the bit pattern of the digital data signals. To continue with the foregoing example, the read/write channel 305 would use a digital-to-analog conversion to convert the 16 individual digital data signals to a single analog signal having a potential level indicative of the desired 16-bit data pattern. For one embodiment, the analog data signal representative of the bit pattern of the digital data signals is indicative of a desired threshold voltage of the target memory cell. However, in programming of a one-transistor memory cells, it is often the case that programming of neighboring memory cells will increase the threshold voltage of previously programmed memory cells. Thus, for another embodiment, the read/write channel 305 can take into account these types of expected changes in the threshold voltage, and adjust the analog data signal to be indicative of a threshold voltage lower than the final desired threshold voltage. After conversion of the digital data signals from the controller 310, the read/write channel 305 would then pass the write command and address signals to the memory device 301 along with the analog data signals for use in programming the individual memory cells. Programming can occur on a cell-by-cell basis, but is generally performed for a page of data per operation. For a typical memory array architecture, a page of data includes every other memory cell coupled to a word line.

For read requests, the controller would pass command and address signals to the read/write channel 305. The read/write channel 305 would pass the read command and address signals to the memory device 301. In response, after performing the read operation, the memory device 301 would return the analog data signals indicative of the threshold voltages of the memory cells defined by the address signals and the read command. The memory device 301 may transfer its analog data signals in parallel or serial fashion.

The analog data signals may also be transferred not as discrete voltage pulses, but as a substantially continuous stream of analog signals. In this situation, the read/write channel 305 may employ signal processing similar to that used in HDD accessing called PRML or partial response, maximum likelihood. In PRML processing of a traditional HDD, the read head of the HDD outputs a stream of analog signals representative of flux reversals encountered during a read operation of the HDD platter. Rather than attempting to capture the true peaks and valleys of this analog signal generated in response to flux reversals encountered by the read head, the signal is periodically sampled to create a digital representation of the signal pattern. This digital representation can then be analyzed to determine the likely pattern of flux reversals responsible for generation of the analog signal pattern. This same type of processing can be utilized with embodiments of the present disclosure. By sampling the analog signal from the memory device 301, PRML processing can be employed to determine the likely pattern of threshold voltages responsible for generation of the analog signal.

Figure 4:
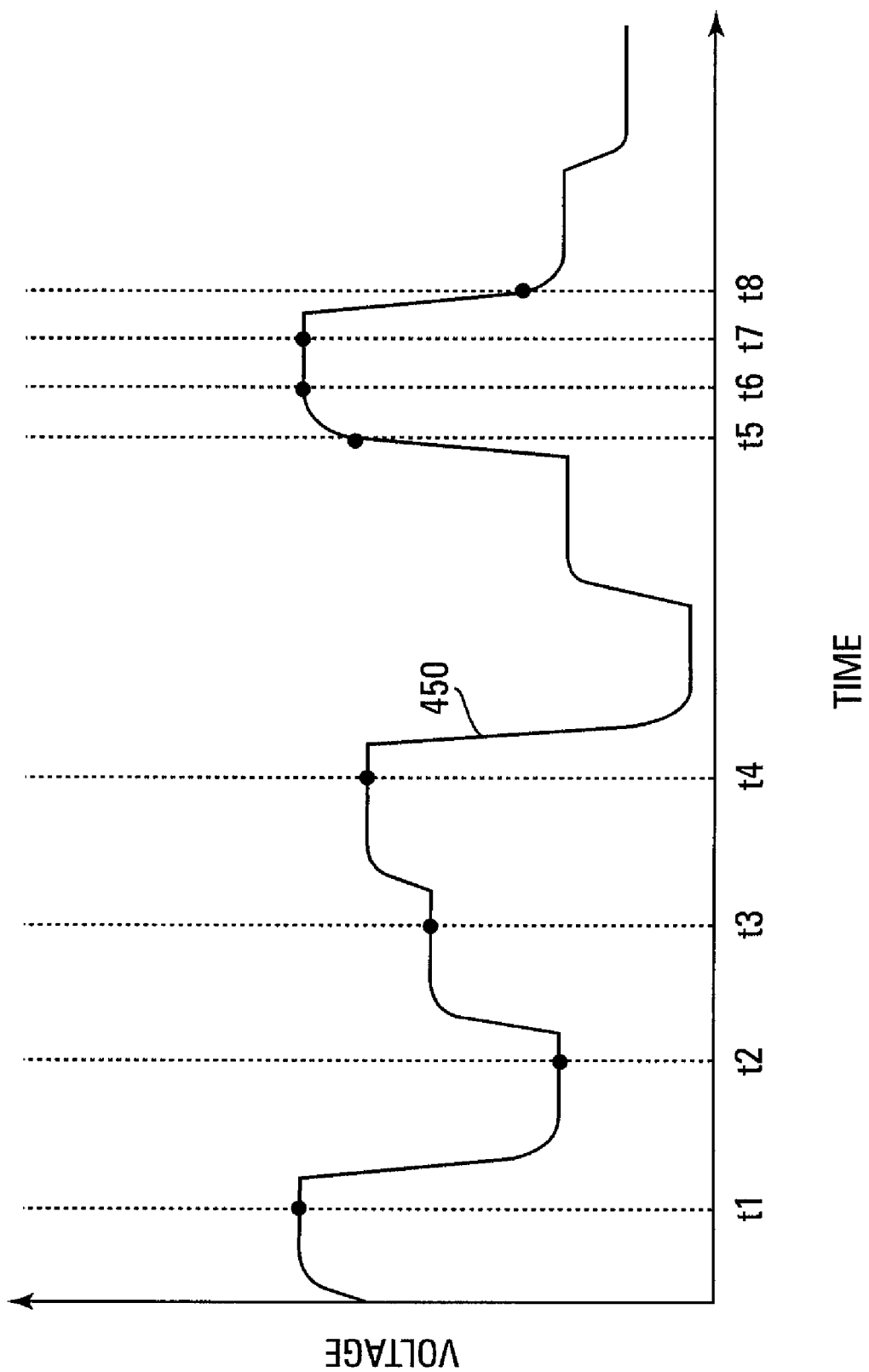
FIG. 4 is a depiction of a wave form showing conceptually a data signal as might be received from the memory device by a read/write channel in accordance with an embodiment of the disclosure.

FIG. 4 is a depiction of a wave form showing conceptually a data signal 450 as might be received from the memory device 301 by the read/write channel 305 in accordance with an embodiment of the disclosure. The data signal 450 could be periodically sampled and a digital representation of the data signal 450 can be created from the amplitudes of the sampled voltage levels. For one embodiment, the sampling could be synchronized to the data output such that sampling occurs during the steady-state portions of the data signal 450. Such an embodiment is depicted by the sampling as indicated by the dashed lines at times t1, t2, t3 and t4. However, if synchronized sampling becomes misaligned, values of the data samples may be significantly different than the steady-state values. In an alternate embodiment, sampling rates could be increased to allow determination of where steady-state values likely occurred, such as by observing slope changes indicated by the data samples. Such an embodiment is depicted by the sampling as indicated by the dashed lines at times t5, t6, t7 and t8, where a slope between data samples at times t6 and t7 may indicate a steady-state condition. In such an embodiment, a trade-off is made between sampling rate and accuracy of the representation. Higher sampling rates lead to more accurate representations, but also increase processing time. Regardless of whether sampling is synchronized to the data output or more frequent sampling is used, the digital representation can then be used to predict what incoming voltage levels were likely responsible for generating the analog signal pattern. In turn, the likely data values of the individual memory cells being read can be predicted from this expected pattern of incoming voltage levels.

Recognizing that errors will occur in the reading of data values from the memory device 301, the read/write channel 305 may include error correction. Error correction is commonly used in memory devices, as well as HDDs, to recover from expected errors. Typically, a memory device will store user data in a first set of locations and error correction code (ECC) in a second set of locations. During a read operation, both the user data and the ECC are read in response to a read request of the user data. Using known algorithms, the user data returned from the read operation is compared to the ECC. If the errors are within the limits of the ECC, the errors will be corrected.

Figure 5:
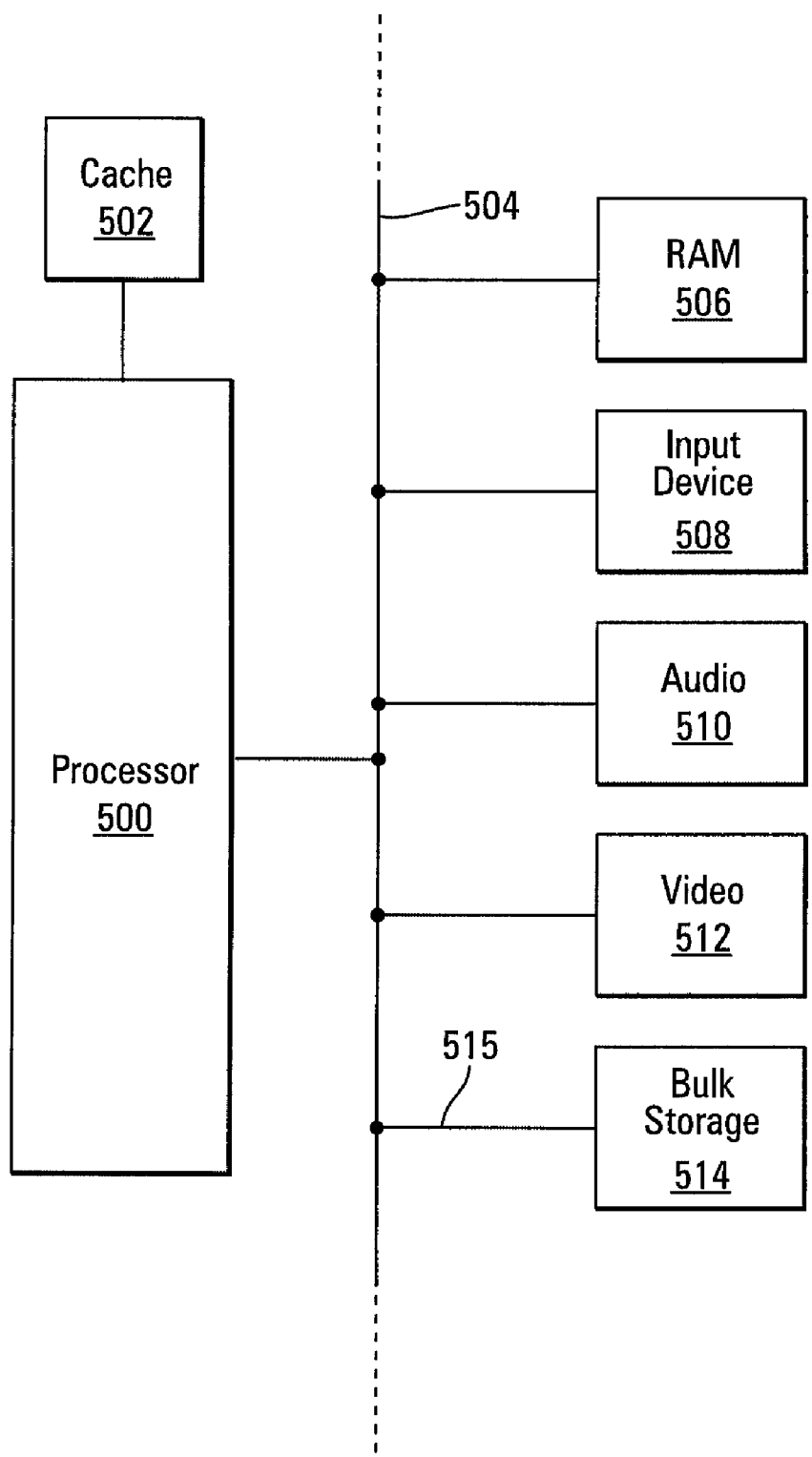
FIG. 5 is a block schematic of an electronic system in accordance with an embodiment of the disclosure.

FIG. 5 is a block schematic of an electronic system in accordance with an embodiment of the disclosure. Example electronic systems may include personal computers, PDAs, digital cameras, digital media players, digital recorders, electronic games, appliances, vehicles, wireless devices, mobile telephones and the like.

The electronic system includes a host processor 500 that may include cache memory 502 to increase the efficiency of the processor 500. The processor 500 is coupled to a communication bus 504. A variety of other devices may be coupled to the communication bus 504 under control of the processor 500. For example, the electronic system may include random access memory (RAM) 506; one or more input devices 508 such as keyboards, touch pads, pointing devices, etc.; an audio controller 510; a video controller 512; and one or more bulk storage devices 514. At least one bulk storage device 514 includes a digital bus interface 515 for communication with the bus 504, one or more memory devices in accordance with an embodiment of the disclosure having an analog interface for transfer of data signals representative of data patterns of two or more bits of data, and a signal processor adapted to perform digital-to-analog conversion of digital data signals received from the bus interface 515 and analog-to-digital conversion of analog data signals received from its memory device(s).

As memory devices transition to using analog signals as described above, methods are needed to discriminate between the information contained in the analog signals that can be stored in a memory cell. Each voltage programmed on a memory cell can be used to represent a logical state of that cell (e.g., 011) and typically have a granularity measured in tenths or hundredths of volts.

Operational amplifiers have typically been used to drive output signals in memory devices. However, operational amplifiers require large amounts of current and take up considerable integrated circuit real estate. The present embodiments use a transistor configured as a source follower as the output data driver. Such a configuration can use less current than an operational amplifier and requires less real estate.

Figure 6:
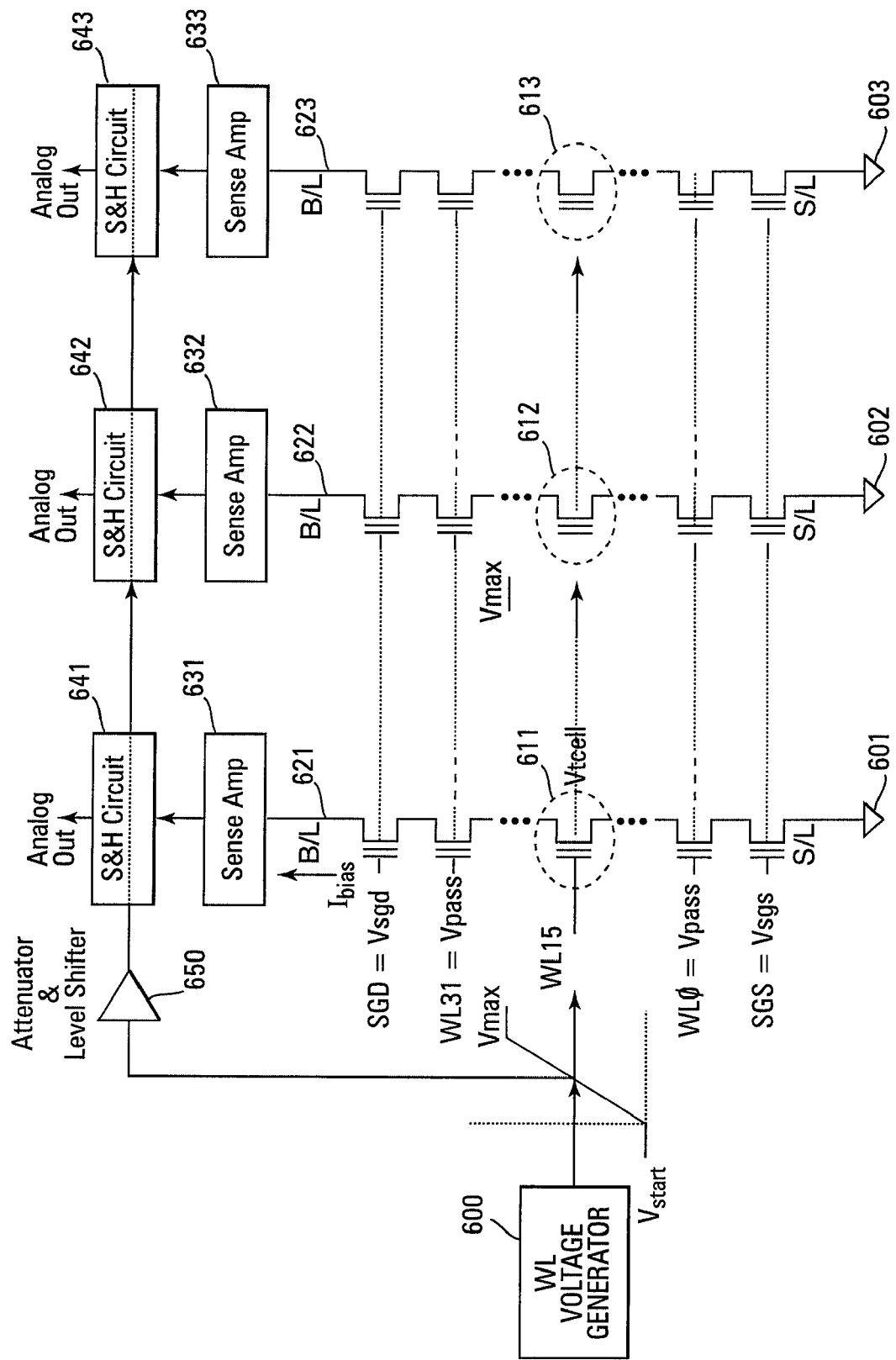
FIG. 6 is a block diagram of one embodiment of a portion of a memory array that incorporates a ramp voltage for sensing and a sample/hold circuit.

FIG. 6 illustrates a block diagram of one embodiment of a portion of a memory array having a sensing circuit that includes a sample and hold circuit. For purposes of clarity, the diagram shows only three series strings 601-603 of memory cells (e.g., floating gate non-volatile cells) that are connected to transfer lines (e.g., bit lines) 621-623. As discussed previously with reference to FIG. 2, a typical series string of memory cells is comprised of 32 memory cells connected in series and connected to a bit line. A memory device can be comprised of a large number of the illustrated series strings.

In illustrating the operation of the method of FIG. 9, the programming of only one cell 611 of word line 15 (WL15) will be discussed. In a typical programming operation, one or more cells 611-613 along a selected select line (e.g., word line) can be programmed substantially simultaneously since they are being biased by the same word line voltage. The bit line biasing determines which particular memory cell 611-613 is enabled for programming.

The circuit of FIG. 6 includes a word line voltage generator 600 that is responsible for generating the word line biasing for the programming, read, and verify operations. In one embodiment, the voltage generator 600 is coupled to either an on-chip controller or an external controller (not shown) that instructs the generator 600 to set to a desired voltage. The voltage generator 600 is able to generate the incrementally increasing programming pulses as well as the ramp read voltage illustrated in FIG. 6 and described subsequently.

A bit line current sensing circuit 631-633 is coupled to each bit line 621-623. The current sensing circuit 631-633 generates a control signal, to its respective sample and hold circuit 641-643, that indicates when a current, $I_{bias}$, is detected on a respective bit line 621-623. The current sensing circuit 631-633 can be a sense amplifier as is typically used in a flash memory device or some other form of current sensing. When a current is detected, this is an indication that the selected transistor 611, 612, or 613 is turned on by the ramping read voltage as discussed subsequently.

Figure 7:
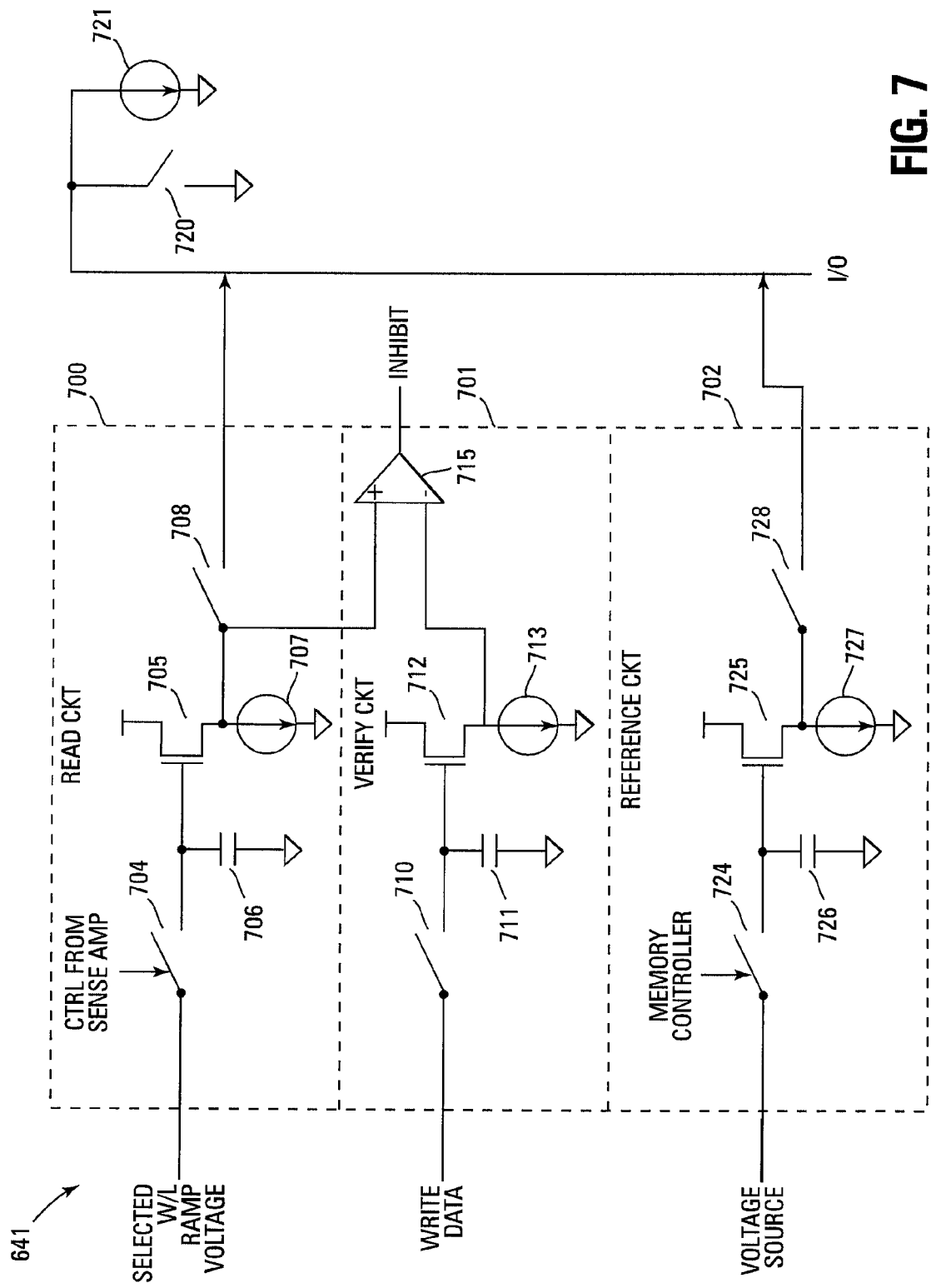
FIG. 7 is a block diagram of one embodiment of the sample and hold circuit with a source follower driver in accordance with the block diagram of FIG. 6.

The sample and hold and comparator circuits 641-643, illustrated in greater detail in FIG. 7, are coupled to both the selected word line, through word line conditioning circuitry, and a respective current sensing circuit 631-633. Each sample and hold circuit 641-643 is responsible for sampling and storing a representation of the voltage at which the selected memory cell is currently programmed, as generated by the word line voltage generator 600. The representation of the voltage is obtained through an attenuator and level shifter circuit 650 that is connected between the sample and hold and comparator circuits 641-643 and the selected word line (e.g., WL15). The attenuator and level shifter circuit 650 generates a conditioned ramp signal that can be a buffered voltage, a level shifted voltage, a reduced voltage, or a combination of these. The sample and hold and comparator circuits 641-643 are also responsible for performing a verify function and generating an inhibit signal when they verify that a selected memory cell 611-613 has been programmed to the target $V_t$.

During a programming operation, the circuits represented by the block diagrams of FIGS. 6 and 7 operate by the word line voltage generator 600 receiving a command to generate one or more programming pulses. The programming pulses bias the word line/control gate of a selected cell 611 that is to be programmed in order to move the $V_t$ of that cell to a target $V_t$ voltage. Thereafter, a verify operation is performed to determine whether the target $V_t$ has been reached or if further programming pulses are needed.

A verify operation can be performed that includes the voltage generator 600 generating a ramp voltage that biases the word line/control gate of the selected cell 611. The ramp voltage starts at $V_{start}$ (e.g., 0V) and can increase to $V_{max}$ (e.g., 5V).

A second ramp voltage from the attenuator/level shifter 650, which is a conditioned version of the ramp voltage used to bias the selected word line, is applied to the sample and hold and comparator circuit 641 that is associated with the selected cell 611. The conditioning of the ramp voltage can be simply buffered, range reduced, level shifted, or any combination of these.

When the selected memory cell 611 turns on, it creates a bit line current that is detected by the current sense circuit 631. The current sense circuit 631 generates a control signal upon detection of the bit line current. The control signal instructs the sample and hold and comparator circuit 641 to store in a data storage device, such as a capacitor 706, an indication of the current voltage level of the conditioned ramp voltage at which the selected cell 611 turned on.

FIG. 7 illustrates a block diagram of one embodiment of one of the sample/hold and comparator circuits 641 of FIG. 6. The other sample/hold and comparator circuits of FIG. 6 that are connected to each bit line can be substantially the same.

The sample/hold and comparator circuit 641 can be comprised of a read circuit 700, a verify circuit 701, and a reference circuit 702. The sample/hold and comparator circuit 641 of FIG. 7 is for purposes of illustration only as the sample/hold and comparing functions can be accomplished in many different ways.

The read circuit 700 is comprised of a voltage storage device 706 that makes up the sample and hold portion of the circuit 641. The illustrated embodiment uses a capacitor 706 to store the voltage. Alternate embodiments may use other means of voltage storage. The capacitor 706 is connected to the selected word line ramp voltage through a switch 704. The switch is controlled by the control signal from the sense amplifier circuit for example. In operation, the selected word line ramp voltage increases until it reaches the $V_t$ that turns on the selected memory cell. During the ramped voltage, the switch is normally closed so that the voltage being stored in the capacitor 706 also increases with the input voltage. When the ramp voltage reaches the $V_t$ of the selected memory cell, current begins to flow in the bit line. The sense amplifier detects the current and generates the control signal that opens the switch 704. The open switch 704 causes an indication of the $V_t$ level that initiated the current flow to be stored in the capacitor 706. This indicates the threshold voltage to which the selected memory cell is currently programmed.

The stored threshold voltage indication is output through an NMOS transistor 705 that is connected to a current source 707 through the source connection of the transistor 705. The drain connection of the transistor 705 is connected to the supply voltage $V_{CC}$.

The NMOS transistor 705 is connected in a source follower configuration to drive the stored threshold voltage indication, through an output switch 708, to the I/O node (e.g., I/O line) of the memory device. During the phase when this particular column is selected, the switch 720 is first closed to discharge the I/O line to ground. One switch 720 is then opened and the output switch 708 is closed to connect the NMOS transistor 705 to the I/O line.

In the present embodiment, the output of the read circuit 700 will not be the same as the $V_t$ representation stored in the capacitor 706. Since the $V_t$ representation is applied to the gate of the NMOS transistor 705, the source of the transistor 705 rises to $V_t-V_{gs}$ where $V_{gs}$ is the gate-to-source voltage drop of the transistor 705. Thus, if $V_t$ is 1.5V and $V_{gs}$ of transistor 705 is 1.0V, then the read circuit will output 0.5V as the read $V_t$.

In one embodiment, the memory controller can read the I/O line and, using a translation table stored in memory, determine that 0.3V on the I/O line equates to a $V_t$ of 1.0V. The translation table could contain a read voltage from the I/O line and its equivalent $V_t$ for the selected memory cell. This embodiment assumes that the voltage drop across the transistor 705 is known and fixed. During this read operation, the verify circuit 701 is not used.

Another embodiment, as illustrated in FIG. 7, uses a reference circuit 702. One such reference circuit 702 is substantially similar to the read circuit 700 in that it is comprised of a switch controlled by the sense amplifier control signal, a storage capacitor 726, an NMOS transistor 725 configured in a source follower configuration with a current source 727 on the source connection, and an output switch 728 that is open until the $V_t$ is stored in the capacitor 726 and the input switch 724 is opened.

The reference circuit 702 operates by the memory controller sending a command to a voltage source, such as the word line voltage generator 600 of FIG. 6, to store the representation of the target $V_t$ of the selected memory cell in the capacitor 726 of the reference circuit 702. The input switch 724 is then opened by the controller to contain the target $V_t$ in the capacitor 726. The reference circuit 702 can then drive this value out, through the output switch 728, to the I/O line. As discussed previously, the I/O line is first discharged by the discharge switch 720 so that the output voltage starts at 0V. Even though the same voltage drop exists across the transistor 725 as in the read circuit 700, the memory controller now knows the actual $V_t$ that was stored in the reference circuit 702. When the reference circuit 702 output is read from the I/O line by the memory controller, the controller knows the $V_t$ value that corresponds to the voltage that was read from the I/O line. Thus, when the controller reads this same voltage during the time that the read circuit 700 is driving its voltage onto the I/O line, it knows the $V_t$ that was stored in the read circuit capacitor 706.

The read circuit 700 output and the reference circuit 702 output can be alternately connected to the I/O line by the memory controller during separate read cycles. The controller can alternate the closing of the respective output switches 708, 728 of each circuit 700, 702 in order to put the desired output onto the I/O line.

The reference circuit has the added benefit of correcting the read circuit $V_t$ for temperature variations. Since the reference circuit output voltage will vary in a similar manner as the read circuit output and the stored $V_t$ value in the reference circuit is known, the memory controller can determine the actual $V_t$ stored in the read circuit by a translation table stored in memory.

The verify circuit 701 includes a comparator function 715 that, in one embodiment, is comprised of an operational amplifier configured as a comparator circuit 715. The comparator circuit 715 compares the voltage from the read circuit 700 output with the voltage from the verify circuit 701 output. The comparator circuit 715 then outputs a logical high when the output of the read circuit 700 is substantially equal to or greater than the output of the verify circuit 701. As described subsequently, the logical high signal at the INHIBIT pin is used to inhibit programming of the memory cell that has reached its threshold voltage.

For operation of the circuit, the voltage to be programmed into the cell is loaded into the sample/hold circuit. This is accomplished by closing switch 710 so that the incoming data is sampled by the capacitor 711. The switch 710 is then opened and the capacitor 711 now holds the target data.

The selected cell is then programmed as described subsequently. Each programming pulse applied to the selected cell moves $V_t$ a certain threshold voltage distance. A read and verify operation is performed between each programming pulse to determine if the $V_t$ has reached the target voltage.

As discussed previously, the read operation is comprised of a representation of a ramp voltage being applied to the input of the read circuit 700 until $V_t$ is reached and stored in the capacitor 706. The output of the source follower transistor 705 is then applied to the input of the comparator circuit 715. If the cell $V_t$ is less than the target $V_t$, the INHIBIT signal indicates (e.g., a logical low signal) that the cell needs an additional program pulse. The above-described programming sequence is then repeated. If the cell $V_t$ is substantially equal to or higher than the target $V_t$, the INHIBIT signal indicates (e.g., a logical high signal) that the cell does not need any further programming pulses and the cell is put into the "inhibit" state.

The "inhibit" state is indicated when the output of the source follower transistor 705 of the read circuit is at least equal to the output of the source follower transistor 712 of the verify circuit 701. At this point, the comparator circuit 715 outputs an INHIBIT signal. In one embodiment, the INHIBIT signal is a logical 1. The INHIBIT signal is used to initiate an inhibit function.

The inhibit function can be accomplished using various methods in response to a circuit receiving the INHIBIT signal. For example, the bit line bias can be changed from the program enable voltage of 0V, used during a programming operation, to $V_{CC}$ that inhibits programming of memory cells coupled to that particular bit line. The bit line voltage can also be varied between 0V and $V_{CC}$ to slow programming instead of completely inhibiting programming.

The representation of the analog ramp voltage for the above embodiments can be a conditioned version of a selected word line ramp voltage. Conditioning operations include reducing the voltage range (e.g., dividing the selected word line ramp voltage by 5), level shifting (e.g., shifting the selected word line ramp voltage where −2V to +3V changes to +2V to +3V), and buffering.

Figure 8:
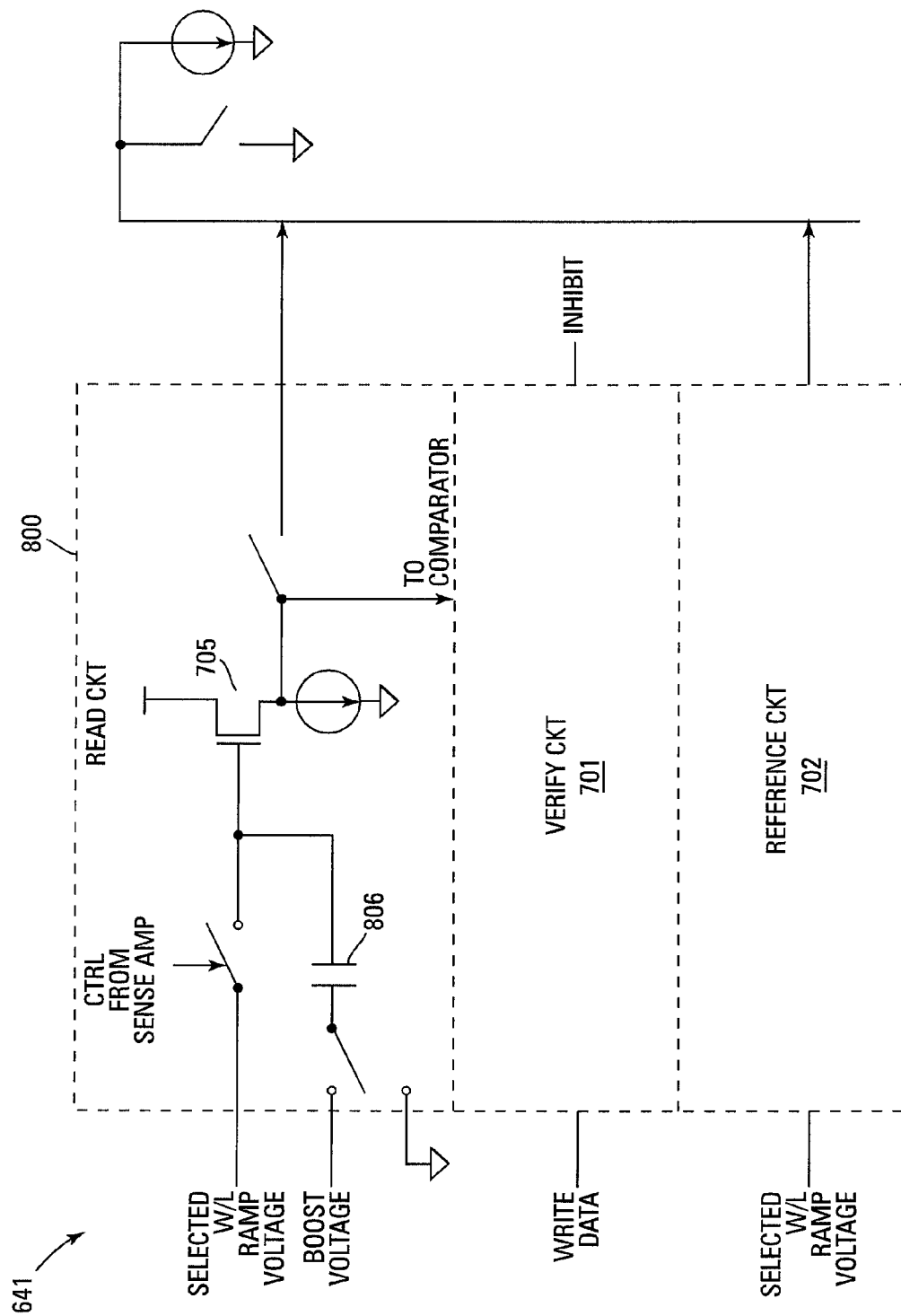
FIG. 8 is a block diagram of an alternate embodiment of the sample and hold circuit with a source follower driver in accordance with the block diagram of FIG. 6.

FIG. 8 illustrates a block diagram of an alternate embodiment of the sample/hold and comparator circuit 641. This circuit is substantially the same as the embodiment of FIG. 7 except the capacitor 806 can be switched between a second signal input and ground.

The embodiment of FIG. 8 shows the second signal input as being a "boost" voltage. This voltage can increase the actual stored $V_t$ in the capacitor in order to compensate for the voltage drop across the source follower transistor 705. For example, if the transistor 705 has a known gate-to-source voltage drop of 1.0V, the boost voltage signal can be 1.0V to compensate. Thus, the output of the read circuit 800 would then be the actual threshold voltage that was read from the memory cell.

Figure 9:
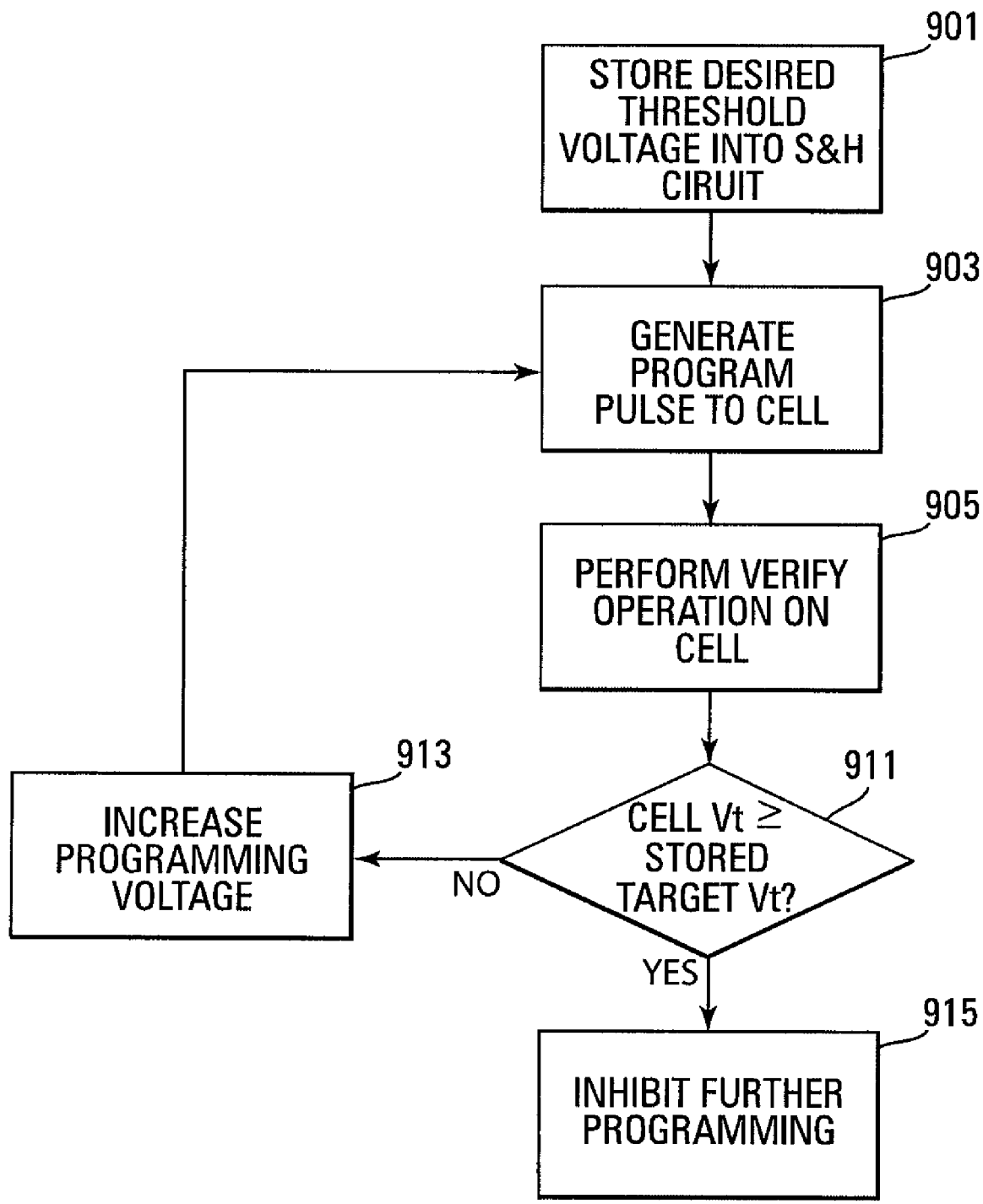
FIG. 9 is a flowchart of one embodiment of a method for analog sensing in a semiconductor memory device.

FIG. 9 illustrates a flowchart of one embodiment of an analog sense method in accordance with the block diagram of FIG. 6.

A target voltage that is representative of the desired voltage (i.e., target data) that is to be programmed into the selected memory cell is stored in the verify circuit portion of the sample/hold circuit 901. In an alternate embodiment, the reference circuit is also programmed with this data. An initial programming pulse is then generated to bias the word line that is connected to the control gate of the selected memory cell 903.

During a typical programming operation, the selected cell is biased by a series of incrementally increasing programming pulses. A memory cell typically starts the programming operation in an erased state with a negative threshold voltage. Each programming pulse increases the threshold voltage, $V_t$, of the memory cell a certain voltage depending on the programming voltage pulse level.

The verify operation as described previously is then performed on the selected memory cell 905 to determine if it is programmed to the target threshold voltage 911. The verify operation determines if the selected cell threshold voltage is greater than or equal to the stored target voltage.

As described previously, the verify operation includes biasing the word line with a ramp voltage until the memory cell starts to conduct and produce a current on the bit line. Once the current sensing circuit detects the bit line current, it generates a control signal indicating to the sample/hold circuitry to store an indication of the current ramped read voltage (which could be the current ramped read voltage), that caused the cell to turn on. The stored, target voltage is compared to the sample and hold voltage from the ramped read voltage in order to determine if the selected memory cell has been programmed to the target threshold voltage 911. In other words, the selected cell is checked to determine if the target data has been programmed.

If the selected memory cell has been programmed 911, further programming of the selected cell is inhibited 915. The bit line inhibit can be accomplished as discussed previously or using some other inhibit method.

If the selected memory cell has not yet reached the target threshold voltage 911, the programming voltage is increased 913. Another programming pulse at the increased programming voltage is then generated and the process repeated until the threshold voltage of the selected cell is substantially the same as the stored voltage to be programmed.

CONCLUSION

The embodiments of the present disclosure perform analog sensing of memory cells in a memory device, such as a solid state memory device, a NAND flash memory, or some other type of memory device. A sample and hold circuit drives an output signal to the I/O of the memory device using a source follower circuit instead of an operational amplifier as used in the prior art. The source follower circuit provides high speed analog drive at lower power requirements while using less integrated circuit real estate than the operational amplifier.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A sample and hold circuit for analog sensing of memory cells in a semiconductor memory device, the circuit comprising:
   a read circuit having a first data storage device for storing a representation of a selected memory cell threshold voltage, the first data storage device coupled to a source follower driver for driving a representation of the selected memory cell threshold voltage to an input/output node; and
   a verify circuit having a second data storage device for storing a representation of a target threshold voltage, the second data storage device coupled to a compare circuit having an input coupled to the read circuit, the compare circuit generating an inhibit signal when the representation of the selected memory cell threshold voltage is at least equal to the target threshold voltage.

2. The circuit of claim 1 and further including a reference circuit coupled to the input/output node for generating a reference voltage that tracks a representation of a cell threshold voltage that was read out.

3. The circuit of claim 1 wherein the representation of output data is the selected memory cell threshold voltage that is reduced by a voltage drop across the source follower driver.

4. The circuit of claim 1 wherein the source follower driver is an NMOS transistor.

5. The circuit of claim 2 and further including a first switch that couples the source follower driver to the input/output node and a second switch that couples the reference circuit to the input/output node.

6. The circuit of claim 4 wherein the source follower driver further comprises a current source coupled to a source connection of the transistor.

7. The circuit of claim 3 wherein the voltage drop is a gate-to-source voltage drop across an NMOS transistor.

8. The circuit of claim 1 wherein the first and second data storage devices are capacitors.

9. A sample and hold circuit for analog sensing of memory cells in a semiconductor, non-volatile memory device, the circuit comprising:
   an input/output node for enabling external data access to the memory device;
   a read circuit coupled to the input/output node, the read circuit comprising a read input switch coupled to a read storage capacitor and a read source follower driver circuit coupled to the read storage capacitor, the read source follower driver outputting a representation of a read threshold voltage from the read storage capacitor to the input/output node;
   a verify circuit coupled to the read circuit, the verify circuit comprising a verify storage capacitor for storing a target threshold voltage representation and a verify source follower driver circuit coupled between the verify storage capacitor and a comparator circuit, the comparator circuit configured to generate an indication that the target threshold voltage is substantially equal to the read threshold voltage; and
   a reference circuit coupled to the input/output node, the reference circuit comprising a reference storage capacitor for storing a representation of a reference threshold voltage, a reference source follower driver circuit is coupled between the reference storage capacitor and the input/output node wherein the reference circuit is configured to output the reference threshold voltage representation through the reference source follower driver to the input/output node.

10. The circuit of claim 9 and further comprising a switch coupled between ground potential and the input/output node wherein, in response to closing the switch, the input/output node is at ground potential.

11. The circuit of claim 9 and further including a processor that is external to the memory device and coupled to the input/output node, the processor configured to read a voltage on the input/output node and translate the voltage into a threshold voltage.

12. The circuit of claim 9 and further including a processor that is external to the memory device and coupled to the input/output node, the processor configured to read a voltage on the input/output node and translate the voltage into a digital bit pattern.

13. The circuit of claim 9 wherein the read circuit further comprises a boost voltage circuit that increases the representation of the read threshold voltage to an actual read threshold voltage.

14. The circuit of claim 9 wherein the read input switch is coupled to an internal sense amplifier that controls operation of the read input switch.

15. A memory device comprising:
an array of memory cells having word lines and bit lines;
a plurality of sample and hold circuits, each sample and hold circuit coupled to a different bit line, each sample and hold circuit configured to store a target threshold voltage representation for a selected cell, each sample and hold circuit comprising:
  a read circuit for storing a representation of a read threshold voltage of the selected cell and outputting the read threshold voltage representation through a source follower driver, the read circuit coupled to a control gate of a selected cell through a read switch;
  a verify circuit, coupled to the read circuit, for storing the target threshold voltage representation and generating an inhibit signal in response to a comparison of the read threshold voltage and the target threshold voltage; and
  a reference circuit for storing a reference threshold voltage and outputting the reference threshold voltage through a source follower driver wherein the reference threshold voltage is indicative of the read threshold voltage; and
a plurality of sensing circuits, each sensing circuit coupled to an associated bit line and to an associated sample and hold circuit, each sensing circuit configured to close an associated read switch in response to detecting a bit line current on the respective associated bit line.

16. The memory device of claim 15 and further including a voltage generator that generates a ramped voltage that is coupled to the selected cell and from which the read threshold voltage is read.

17. The memory device of claim 15 wherein the read circuit and the reference circuit are switchably coupled to an input/output node wherein the read circuit is coupled to the input/output node during first portion of a read operation and the reference circuit is coupled to the input/output node during a portion o f the read operation such that the read circuit is disconnected from the input/output node during the second portion.

18. The memory device of claim 15 wherein read circuit, the verify circuit, and the reference circuit are each comprised of a capacitor for storing the representation of the read threshold voltage, the target threshold voltage, and the reference threshold voltage, respectively.

* * * * *